United States Patent

Son et al.

[11] Patent Number: 5,844,857
[45] Date of Patent: Dec. 1, 1998

[54] ROW ADDRESS CONTROL CIRCUITS HAVING A PREDECODING ADDRESS SAMPLING PULSE GENERATOR AND METHODS FOR MEMORY DEVICES

[75] Inventors: Moon-hae Son, Seoul; Jin-man Han, Kyungki-do, both of Rep. of Korea

[73] Assignee: Samsung Electronics Co., Ltd., Suwon, Rep. of Korea

[21] Appl. No.: 934,434

[22] Filed: Sep. 19, 1997

[30] Foreign Application Priority Data

Jan. 10, 1997 [KR] Rep. of Korea ............. 1997-521

[51] Int. Cl.[6] .................................................. G11C 8/00
[52] U.S. Cl. .................................. 365/230.06; 365/194
[58] Field of Search ................... 365/230.03, 230.06, 365/230.08, 230.09, 193, 194, 203, 222, 233

[56] References Cited

U.S. PATENT DOCUMENTS

5,471,425 11/1995 Yumitori et al. ............. 365/230.03
5,521,878 5/1996 Ohtani et al. ............. 365/230.08

Primary Examiner—Son T. Dinh
Assistant Examiner—David Lam
Attorney, Agent, or Firm—Myers Bigel Sibley & Sajovec

[57] ABSTRACT

A row address control circuit for a memory device includes a row address enable signal generator, a row address buffer, a row predecoder, a row address strobe buffer, a predecoded row address sampling pulse generator, and a row decoder. The row address enable signal generator produces a row address enable signal which is enabled while a clock signal is enabled. The row address buffer receives the output of the row address enable signal generator and produces a row address signal enabled while the row address enable signal is enabled. The row predecoder receives and predecodes the output of the row address buffer and produces a predecoded row address signal. The row address strobe buffer receives the clock signal and produces a first control signal while the clock signal is enabled. The predecoded row address sampling pulse generator receives the output of the row address strobe buffer and produces a predecoded row address sampling pulse signal for selecting the predecoded row address signal while the first control signal is enabled. The row decoder receives the output of the predecoded row address sampling pulse generator and the row predecoder and has its output connected to a word line and activates the word line when the predecoded row address signal and the predecoded row address sampling pulse signal are enabled.

17 Claims, 8 Drawing Sheets

ROW ADDRESS CONTROL CIRCUITS HAVING A PREDECODING ADDRESS SAMPLING PULSE GENERATOR AND METHODS FOR MEMORY DEVICES

FIELD OF THE INVENTION

The present invention relates to integrated circuit memory devices, such as semiconductor memory devices, and more particularly, to control circuits and methods for memory devices.

BACKGROUND OF THE INVENTION

Integrated circuit memory devices are widely used in consumer and industrial systems. As these systems become more sophisticated, it is generally desirable to increase the operational speed of the memory devices. As a result, the time for accessing data stored in a memory cell of a memory device has been reduced to tens of nanoseconds.

Figure 1:
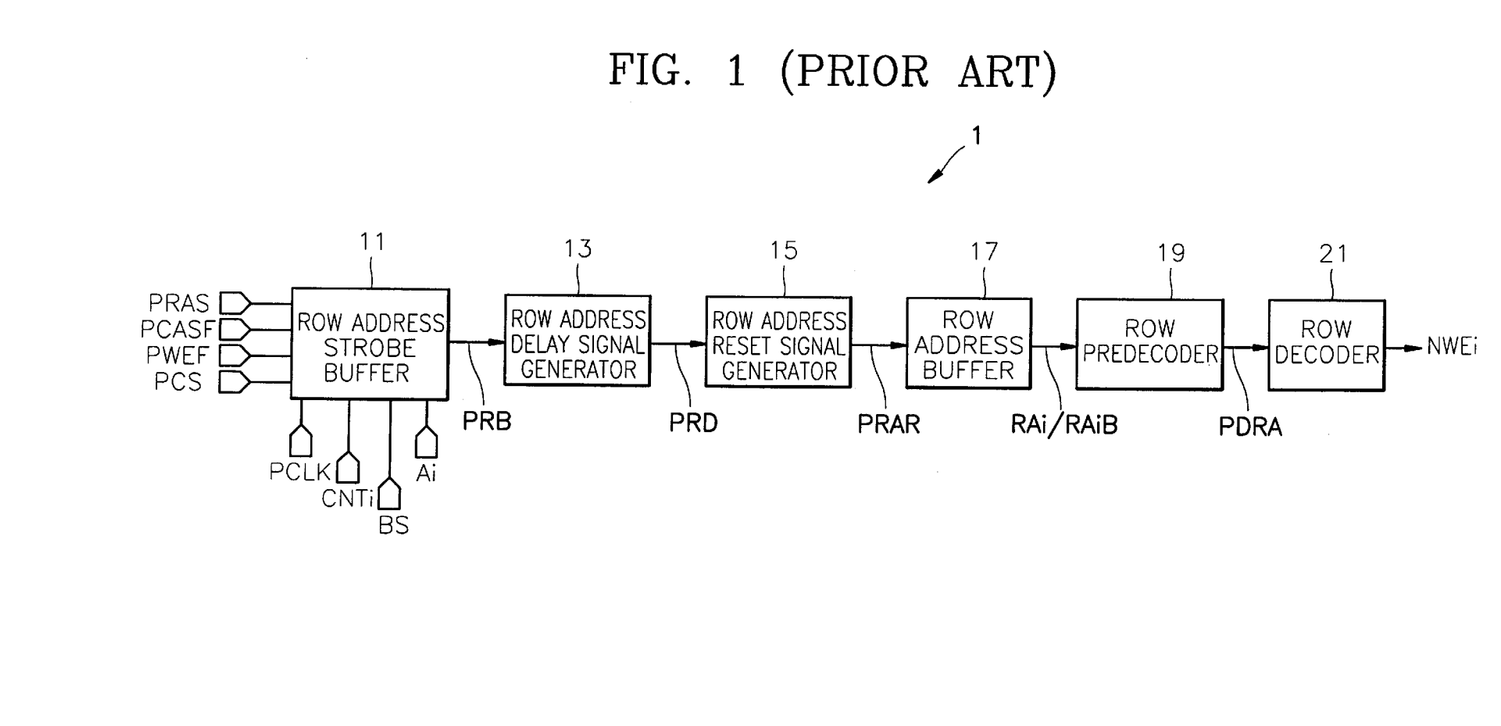
FIG. 1 is a block diagram of a conventional row address control circuit of a memory device.

FIG. 1 is a block diagram of a conventional row address control circuit 1 of a memory device. The row address control circuit 1 which is used, for example, in a Synchronous Dynamic Random Access Memory (SDRAM) device includes a row address strobe buffer 11 which receives an internal clock signal PCLK, a refresh count signal CNTi and a bank selection signal BS for selecting a memory bank. A row address delay signal generator 13 receives a PRB signal produced from the row address strobe buffer 11. A row address reset signal generator 15 receives a PRD signal produced from the row address delay signal generator 13. A row address buffer 17 receives a PRAR signal produced from the row address reset signal generator 15. A row predecoder 19 receives a row address signal RAi/RAiB produced from the row address buffer 17. Finally, a row decoder 21 receives a PDRA signal produced from the row predecoder 19 and drives a word line NWEi. The operation of word lines to address memory cells of a memory are well known to those having skill in the art and need not be described further therein.

Figure 2:
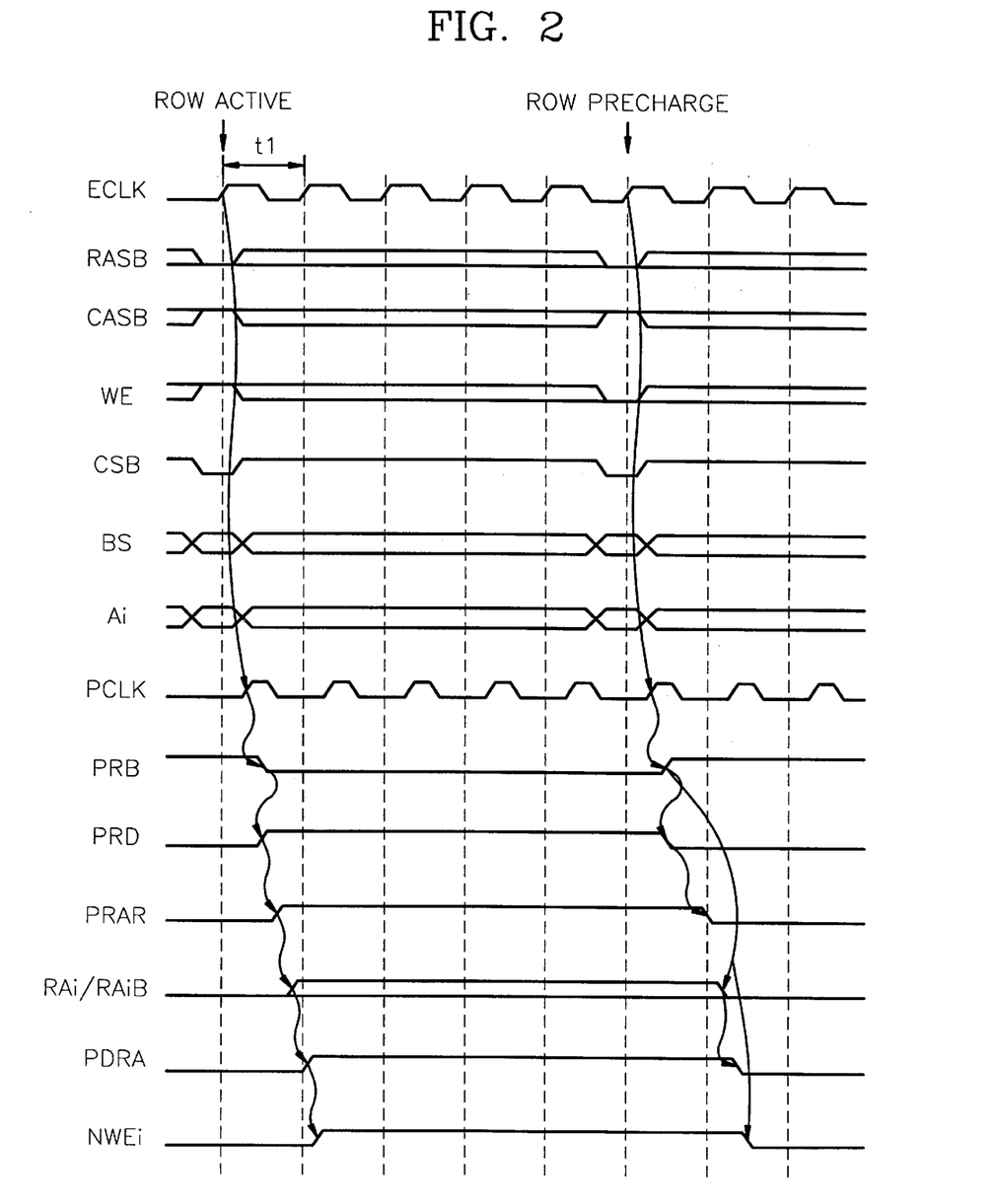
FIG. 2 is a timing diagram of signals shown in FIG. 1.

FIG. 2 is a timing diagram of the signals shown in FIG. 1. The operation of the row address control circuit 1 of FIG. 1 will be described with reference to FIG. 2. In a normal row active operation mode, an external clock signal ECLK, a column address strobe signal CASB, a data writing enable signal WE, a chip selection signal CSB, and an address signal Ai are input to the memory device. When the BS and Ai signals are received, the RASB and CSB signals are low, and the CASB and WE signals are high, if the ECLK goes high, then PCLK toggles high. When PCLK is high, a logic low PRB signal is produced from the row address strobe buffer 11. The row address delay signal generator 13 produces a logic high PRD signal in response to the PRB signal. When PRD toggles high, the row address reset signal generator 15 produces a logic high PRAR. When the PRAR signal toggles high, the row address buffer 17 produces RAi and RAiB which is the complementary signal of RAi. When the RAi and RAiB signals are input, the row predecoder 19 produces PDRA, and when the PDRA signal is input, the row decoder 21 activates a word line NWEi to a logic high level.

As described above, conventionally, delay time longer than one cycle time t1 of the ECLK signal is generated for activating the word line NWEi after the ECLK signal is input. A reduction in time to activate the word line NWEi may increase the operating speed of a synchronous DRAM device.

SUMMARY OF THE INVENTION

It is therefore an object of the present invention to provide a row address control circuits and methods for a memory devices which can reduce the time required to activate a word line.

This and other objects are provided, according to the invention, by memory devices comprising a row address enable signal generator, a row address buffer, a row predecoder, a row address strobe buffer, a predecoded row address sampling pulse generator, and a row decoder. The row address enable signal generator produces a row address enable signal which is enabled while a clock signal is enabled. The row address buffer receives the output of the row address enable signal generator and produces a row address signal which is enabled while the row address enable signal is enabled. The row predecoder receives and predecodes the output of the row address buffer and produces a predecoded row address signal.

The row address strobe buffer receives the clock signal and produces a first control signal while the clock signal is enabled. The predecoded row address sampling pulse generator receives the output of the row address strobe buffer and produces a predecoded row address sampling pulse signal for selecting the predecoded row address signal while the first control signal is enabled.

Finally, the row decoder receives the output of the predecoded row address sampling pulse generator and the row predecoder. The row decoder has an output which is connected to a word line and which activates the word line when the predecoded row address signal and the predecoded row address sampling pulse signal are enabled.

Associated methods are also provided. Accordingly, the time for activating the word line is reduced, for example, by approximately 25% compared to the conventional devices and methods.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
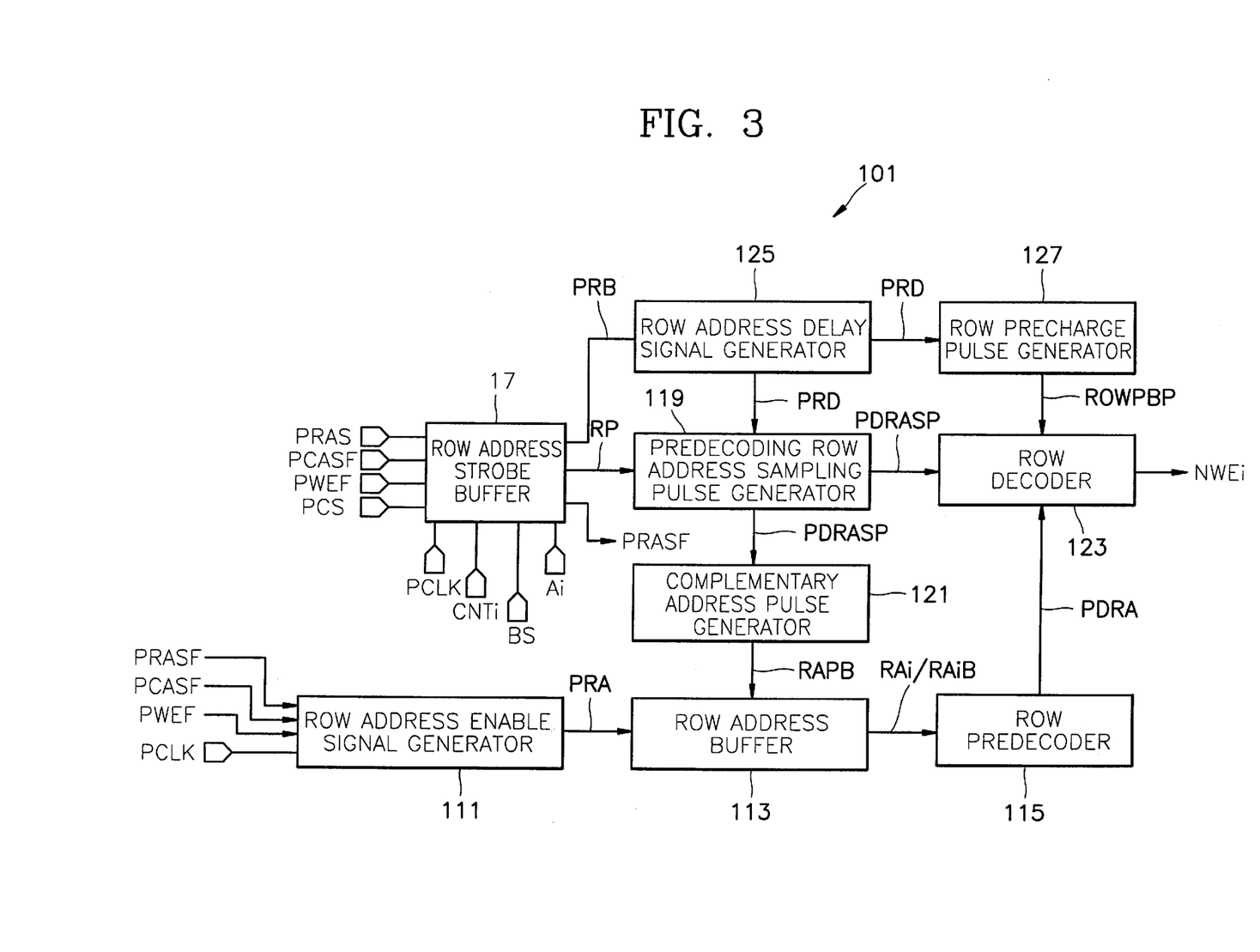
FIG. 3 is a block diagram of row address control circuits and methods of memory devices according to the present invention.

Referring now to FIG. 3, a row address control circuit 101 which is used in a synchronous DRAM semiconductor device includes a row address enable signal generator 111, a row address buffer 113, a row predecoder 115, a row address strobe buffer 117, a predecoded row address sampling pulse generator 119, a row decoder 123, a row address delay signal generator 125, and a row address precharge pulse generator 127.

The row address enable signal generator 111 receives PCLM, PRASF, PCASF, and PWEF signals and produces row address enable signal PRA. The row address buffer 113 receives PRA from the row address enable signal generator 111 and a complementary row address pulse signal RAPB from the complementary address pulse generator 121 and produces a row address signal RAi/RAiB. The row predecoder 115 receives row address signals RAi/RAiB from the row address buffer 113 and produces a predecoded row address signal PDRA. The row address strobe buffer 117 receives PRAS, PCLK, CNTi, BS, PCASF, PWEF, and PCS signals and produces a first control signal RP, a second control signal PRASF, and a third control signal PRB. The predecoded row address sampling pulse generator 119 receives RP signal and PRD signal and produces a predecoded row address sampling pulse signal PDRASP. The complementary row address pulse generator 121 receives PDRASP signal and produces a complementary address pulse signal RAPB. The row precharge pulse generator receives PRD signal and produces a row precharge pulse ROWPBP. The row decoder receives PDRASP, PDRA and ROWPBP signals and activates the word line NWEi.

In the row address strobe buffer 117, an input signal of a Transistor-Transistor Logic (TTL) level is converted to a Complementary Metal Oxide Semiconductor (CMOS) level appropriate for a synchronous DRAM device.

In the predecoded row address sampling pulse generator 119, during a normal row active operation, when RP toggles high, a logic high pulse is generated to activate a word line NWEi connected to the output of the row decoder 123. In the complementary row address pulse generator 121, when PDRASP toggles low, a logic low RAPB signal is generated, to thereby precharge an output signal RAi of the row address buffer 113 to a logic low level. In the row precharge pulse generator 127, when the PRD is disabled, a logic low ROWPBP signal is produced to precharge a word line NWEi connected to an output of the row decoder 123 to a logic low level.

The PRAS is the complementary signal of the RASB, and the PRASF is a signal having the same phase as that of the PRAS. The PCASF is the complementary signal of a column address strobe signal CASB, the PWEF is the complementary signal of a data writing enable signal WE, and the PCS is the complementary signal of a chip selection signal CSB. The CNTi is a refresh count signal for performing a refresh operation, and the BS is a memory bank selection signal for selecting a memory bank.

Figure 4:
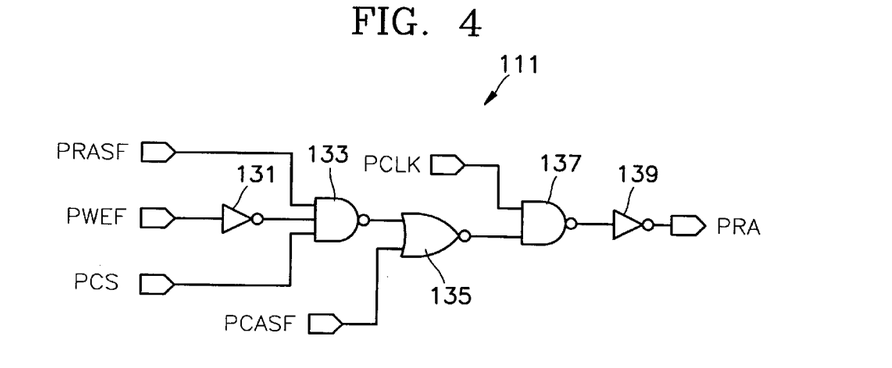
FIG. 4 is a circuit diagram of the row address enable signal generator shown in FIG. 3.

FIG. 4 is a circuit diagram of the row address enable signal generator 111 shown in FIG. 3. The row address enable signal generator 111 includes a first inverter 131 which inverts the PWEF signal; a first NAND gate 133 which receives the output of the first inverter 131, the PRASF signal which is enabled by the PCLK, and the PCS signal; a first NOR gate 135 which receives the output of the first NAND gate 133 and the PCASF signal; a second NAND gate 137 which receives the output of the first NOR gate 135 and the PCLK signal, and a second inverter 139 which inverts the output of the second NAND gate 137 and produces a row address enable signal PRA.

Figure 5:
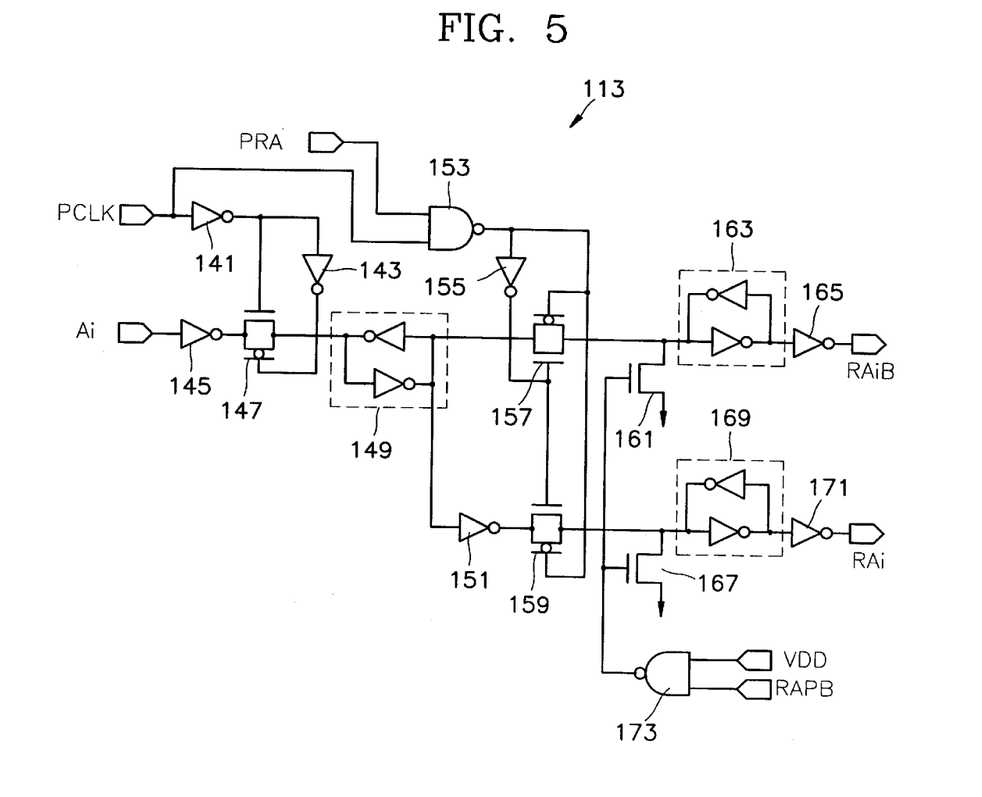
FIG. 5 is circuit diagram of the row address buffer shown in FIG. 3.

FIG. 5 is a circuit diagram of the row address buffer 113 shown in FIG. 3. The row address buffer 113 includes a third inverter 141 which inverts PCLK signal; a fourth inverter 143 which inverts the output of the third inverter 141; a fifth inverter 145 which inverts an external address signal Ai; and a first transmission gate 147 having its input connected to the output of the third inverter 145 and its gate connected to the output of the third inverter 141 and its complementary gate connected to the output of the fourth inverter 143. Also included is a first latch 149 which receives and latches the output of the first transmission gate 147; a sixth inverter 151 which inverts the output of the first latch 149; a third NAND gate 153 which receives the PRA and PCLK signals; and a seventh inverter 155 which inverts the output of the third NAND gate 153. Also included is a second transmission gate 157 having its complementary gate connected to the output of the third NAND gate 153, its gate connected to the output of the seventh inverter 155, and its input connected to the output of the first latch 149; a third transmission gate 159 having its complementary gate connected to the output of the third NAND gate 153, its gate connected to the output of the seventh inverter 155, and its input connected to the output of the sixth inverter 151; a first NMOS transistor 161 having its drain connected to the output of the second transmission gate 157 and its source grounded; a second latch portion 163 having its input connected to the drain of the first NMOS transistor 161; and an eighth inverter 165 which inverts the output of the second latch 163 and produces the RAi signals. Finally, also included is a second NMOS transistor 167 having its drain connected to the output of the third transmission gate 159 and its source grounded; a third latch 169 having its input connected to the drain of the second NMOS transistor 167; a ninth inverter 171 which inverts the output of the third latch 169 and produces the RAi signal; and a fourth NAND gate 173 which receives a complementary row address pulse RAPB and a power supply VDD and produces a corresponding signal to the commonly connected gates of the first and second NMOS transistors 161 and 167.

Figure 6:
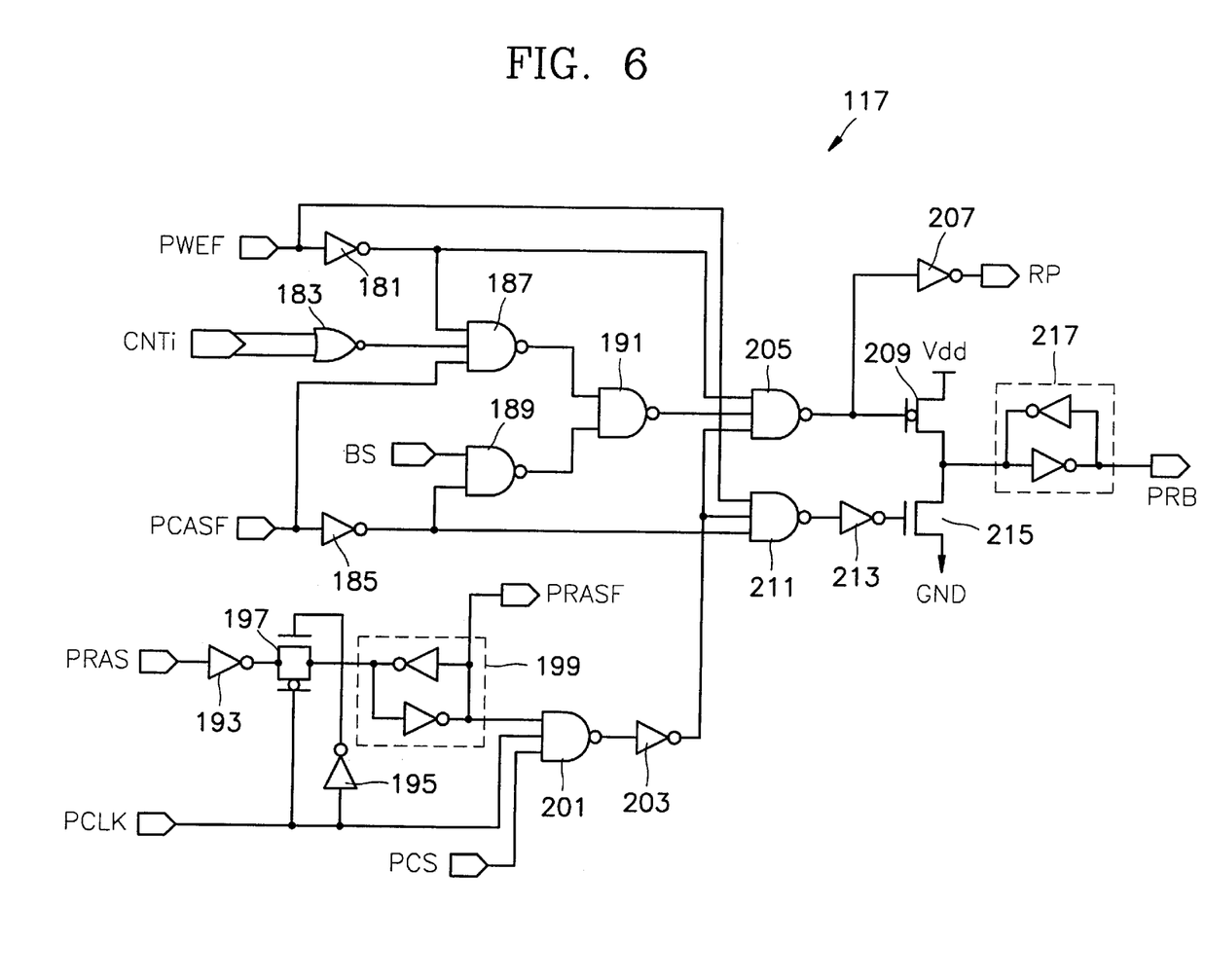
FIG. 6 is a circuit diagram of the row address strobe buffer shown in FIG. 3.

FIG. 6 is a circuit diagram of the row address strobe buffer 117 shown in FIG. 3. The row address strobe buffer 117 includes a tenth inverter 181 which inverts the PWEFF signal; a second NOR gate 183 which receives the CNTi signal; an eleventh inverter 185 which inverts the PCASF signal, a fifth NAND gate 187 which receives the output of the tenth inverter 181, the output of the second NOR gate 183 and the PCASF signal; a sixth NAND gate 189 which receives the BS signal and the output of the eleventh inverter 185; a seventh NAND gate 191 which receives the output of the fifth NAND gate 187 and the output of the sixth NAND gate 189; a twelfth inverter 193 which inverts the PRAS signal; and a thirteenth inverter 195 which inverts the PCLK signal. Also included is a fourth transmission gate 197 having its complementary gate connected to the PCLK signal, its gate connected to an output of the thirteenth inverter 195, and its input connected to the output of the twelfth inverter 193, a fourth latch 199 which receives the output of the fourth transmission gate and produces the second control signal PRASF; an eighth NAND gate 201 which receives the output of the fourth latch 199, the PCLK signal and the PCS signal; a fourteenth inverter 203 which inverts the output of the eighth NAND gate 201; a ninth NAND gate 205 which receives the output of the tenth inverter 181, the output of the seventh NAND gate 191, and the output of the fourteenth inverter 203; and a fifteenth inverter 207 which inverts the output of the ninth NAND gate 205 and produces the first control signal RP. Also included is a first PMOS transistor 209 having its gate connected to the input of the fifteenth inverter 207 and its source connected to a power supply Vdd; a tenth NAND gate 211 which receives the PWEF signal, the output of the eleventh inverter 185, and the output of the fourteenth inverter 203; a sixteenth inverter 213 which inverts the output of the tenth NAND gate 211; a third NMOS transistor 215 having its gate connected to the output of the sixteenth inverter 213, its drain connected to the drain of the first PMOS transistor 209, and its source grounded; and a fourth latch 217 having its input connected to the drain of the third NMOS transistor 215 for producing the third control signal PRB.

Figure 7:
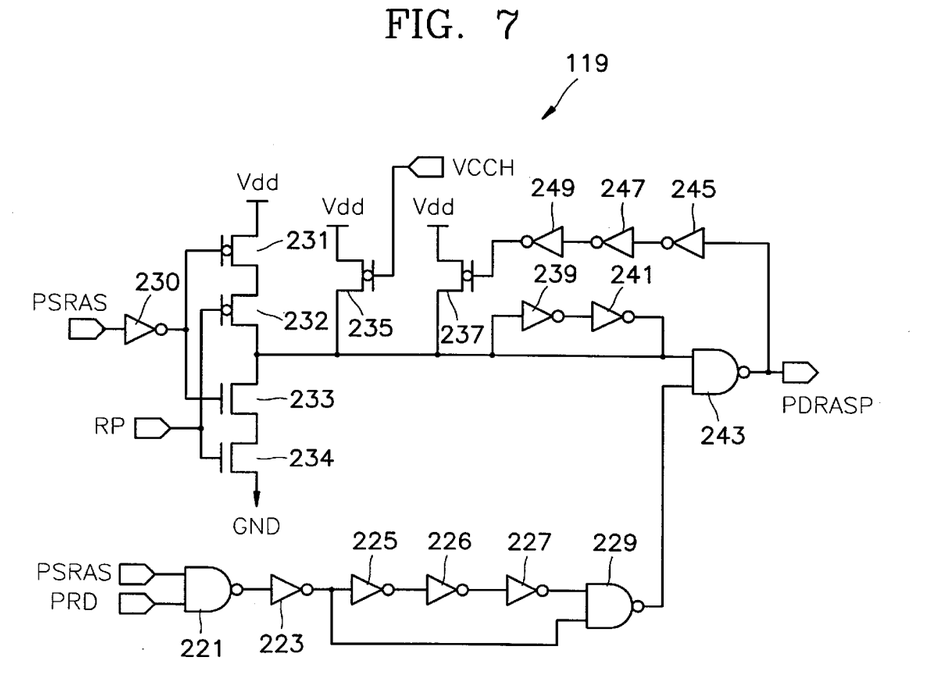
FIG. 7 is a circuit diagram of the predecoded row address sampling pulse generator shown in FIG. 3.

FIG. 7 is a circuit diagram of the predecoded row address sampling pulse generator 119 shown in FIG. 3. The predecoded row address sampling pulse generator 119 includes an eleventh NAND gate 221 which receives a self refresh operation signal PSRAS which is enabled during a self refresh operation and a fourth control signal PRD; a seventeenth inverter 223 which inverts the output of the eleventh NAND gate 221; eighteenth to twentieth inverters 225, 226, 227 serially connected to the output of the seventeenth inverter 223; a twelfth NAND gate 229 which receives the output of the eighteenth inverter 223 and the output of the twentieth inverter 227 and a twenty-first inverter 230 which inverts the PSARS signal. Also included is a second PMOS transistor 231 having its gate connected to the output of the twenty-first inverter 230 and its source connected to the power source voltage Vdd; a third PMOS transistor 232 having its gate connected to the RP signal and its source connected to the drain of the second PMOS transistor 231; a fourth NMOS transistor 233 having its gate connected to the output of the twenty-first inverter 230 and its drain connected to the drain of the third PMOS transistor 232; a fifth NMOS transistor 234 having its gate connected to the RP signal, its drain connected to the source of the fourth NMOS transistor 233 and its source grounded. Also included is a fourth PMOS transistor 235 having its drain connected to the drain of the fourth NMOS transistor 233, its source connected to the power source voltage Vdd and its gate connected to a Vcch signal; a fifth PMOS transistor 237 having its drain connected to the drain of the fourth PMOS transistor 235 and its source connected to the power source voltage Vdd; a twenty-second inverter 239 having its input connected to the drain of the fourth PMOS transistor 237; and a twenty-third inverter 241 having its input connected to the output of the twenty-second inverter 239. Finally, also included is a thirteenth NAND gate 243 which receives the outputs of the twenty-third inverter 241 and the twelfth NAND gate 229 and produces a predecoded row address sampling pulse PDRASP; twenty-fourth and twenty-fifth inverters 245 and 247 serially connected to the output of the thirteenth NAND gate 243, and a twenty-sixth inverter 249 having its input connected to the output of the twenty-fifth inverter 247 and its output connected to the gate of the fifth PMOS transistor 237.

Figure 8:
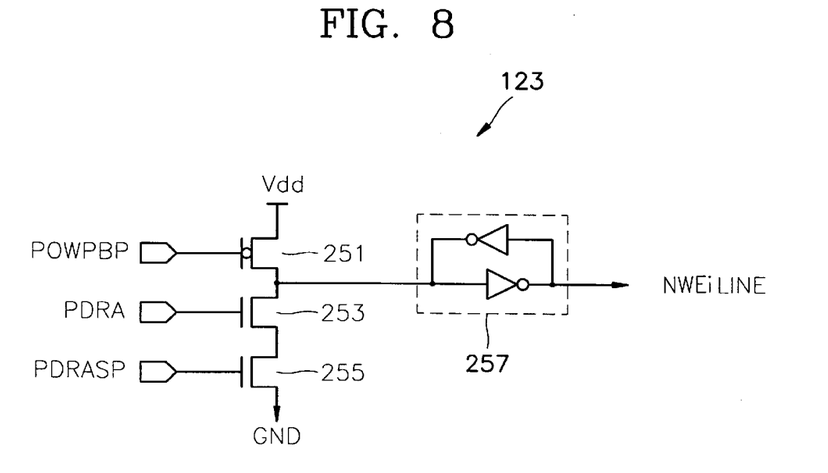
FIG. 8 is a circuit diagram of the row decoder shown in FIG. 3.

FIG. 8 is a circuit diagram of the row decoder 123 shown in FIG. 3. The row decoder 123 includes a sixth PMOS transistor 251 having its gate connected to a fifth control signal ROWPBP for precharging a word line during enabling and its source connected to the power source voltage Vdd; a sixth NMOS transistor 253 having its drain connected to the drain of the sixth PMOS transistor 251 and its gate connected to the PDRA signal; a seventh NMOS transistor 255 having its drain connected to the source of the sixth NMOS transistor 253, its gate connected to the PDRASP signal and its source grounded; and a fifth latch 257 having its input connected to the drain of the sixth NMOS transistor 253 and its output connected to the word line NWEi.

Figure 9:
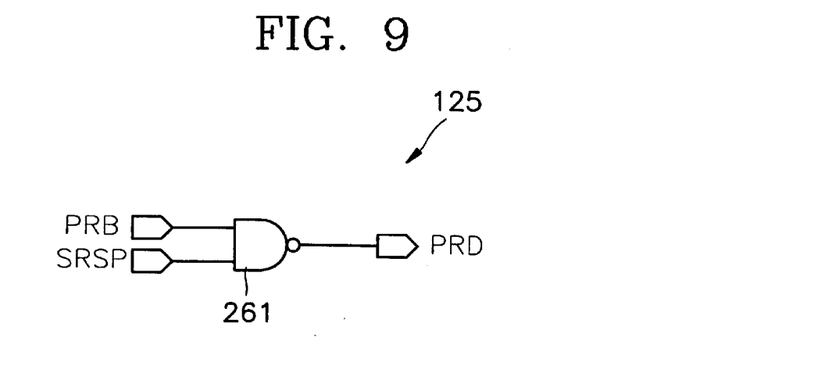
FIG. 9 is a circuit diagram of the row address delay signal generator shown in FIG. 3.

FIG. 9 is a circuit diagram of the row address delay signal generator 125 shown in FIG. 3. The row address delay signal generator 125 includes a fourteenth NAND gate 261 which receives the PRB signal and a self refresh period oscillator output signal SRSP for periodically generating a pulse during a self refresh operation and producing the PRD signal.

Figure 10:
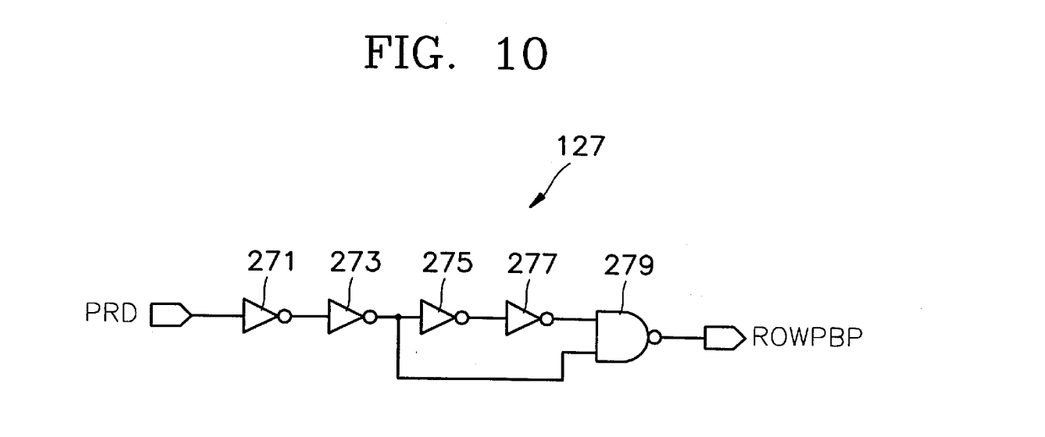
FIG. 10 is a circuit diagram of the row precharge pulse generator shown in FIG. 3.

FIG. 10 is a circuit diagram of the row precharge pulse generator 127 shown in FIG. 3. The row precharge pulse generator 127 includes a twenty-seventh inverter 271 which inverts the PRD signal, twenty-eighth through thirtieth inverters 273, 275, 277 serially connected to the output of the twenty-seventh inverter 271; and a fifteenth NAND gate 279 which receives the outputs of the twenty-eighth inverter 273 and the thirtieth inverter 277 and produces the fifth control signal ROWPBP.

Figure 11:
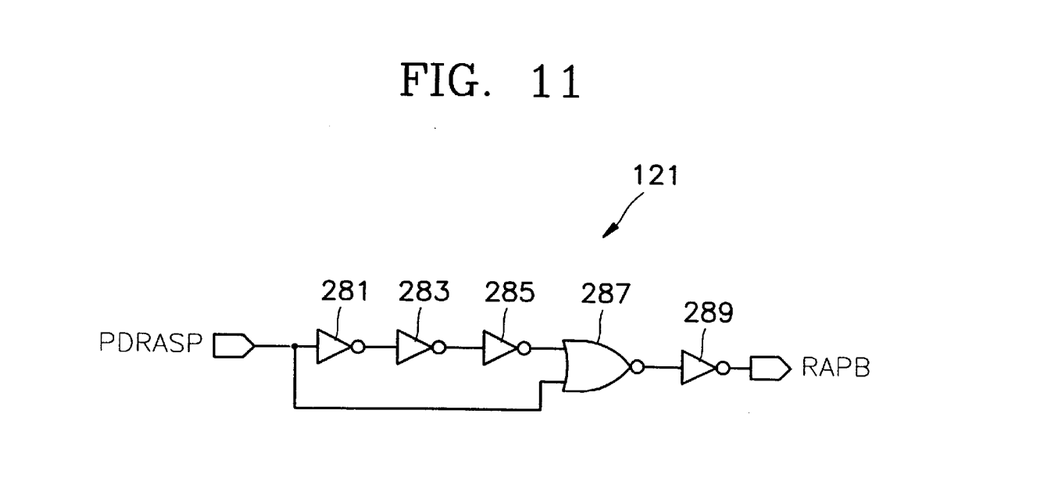
FIG. 11 is a circuit diagram of the complementary row address pulse generator shown in FIG. 3.

FIG. 11 is a circuit diagram of the complementary row address pulse generator 121 shown in FIG. 3. The complementary row address pulse generator 121 includes a thirty-first inverter 281 which inverts the PDRASP signal; a thirty-second inverter 283 which inverts the output of the thirty-first inverter 281; a thirty-third inverter 285 which inverts the output of the thirty-second inverter 283; a third NOR gate 287 which receives the PDRASP signal and the output of the thirty-third inverter 285, and a thirty-fourth inverter 289 which inverts the output of the third NOR gate 287 and produces the complementary row address pulse RAPB.

Figure 12:
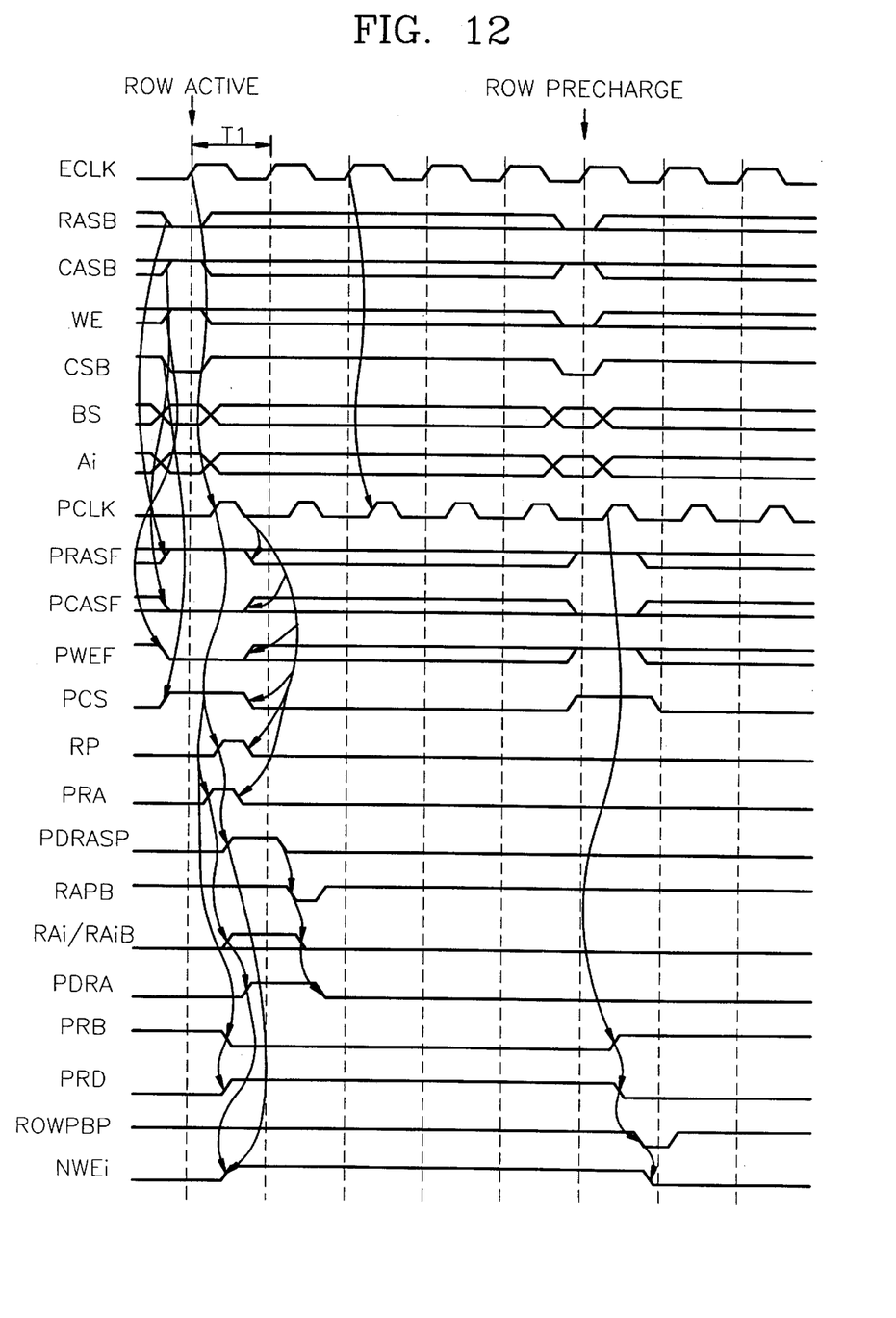
FIG. 12 is a timing diagram of signals shown in FIG. 3.

The operation of the circuits shown in FIGS. 3 through 11 will now be described with reference to FIG. 12. During a normal row active operation mode, the RASB and CSB signals input to a synchronous DRAM semiconductor device are low, and the CASB and WE signals are high. The RASB and CSB signals are inverted to a logic high and then PRAS and PCS are produced. The CASB and WE signals are inverted to a logic low and then PCASF and PWEF are produced. The PRAS, PCS, PCASF and PWEF are input to the row address strobe buffer 117. The BS and Ai also are input to the row address strobe buffer 117.

In this state, when an external clock signal ECLK is toggled high, the PCLK is toggled high. When the PCLK is toggled high, a PRASF signal of a logic high is generated. When the PCLK, the PRAS and PCS signals are toggled high and the PCASF and PWEF signals are toggled low, the PRB signal produced from the row address strobe buffer 117 toggles low and RP toggles high.

At the same time, the output of the first NAND gate 133 of the row address enable signal generator 111 shown in FIG. 4 toggles low and the output of the first NOR gate 135 toggles high. Also, since PCLK is a logic high the output of the second NAND gate 137 toggles low and PRA toggles high.

When PRA and PCLK of FIG. 5 toggle high, the second transmission gate 157 and the third transmission gate 159 are activated. Accordingly, the Ai signal latched in the first latch 149 is also latched by the second and third latch 163 and 169, so that RAi is enabled (logic high) and RAiB is enabled (logic low). Here, Ai has already been latched in the first latch 149 through the first transmission gate 147 to be turned-on while PCLK is a logic low. When PCLK toggles high, the first transmission gate 147 is turned-off. Accordingly, Ai does not pass through the first transmission gate 147 while PCLK is logic high. As described above, when PCLK is generated, PRA is enabled. When PRA is enabled, RAi is enabled. Accordingly, the time required for enabling RAi can be very short. When RAi is enabled, an output signal PDRA of the row predecoder 115 toggles high.

In FIG. 7, the PSRAS is always in a logic low state. Accordingly, when RP toggles high, the fourth NMOS transistor 233 and the fifth NMOS transistor 234 are activated, so that the output of the twelfth NAND gate 243 toggles high. Accordingly, PDRASP is in a logic high state.

In FIG. 8, the fifth NMOS transistor 253 is in an active state since PDRA is in a logic high state. Accordingly, as soon as PDRASP toggles high, the seventh NMOS transistor 255 is activated, so that the input of the fifth latch portion 257 toggles low. Accordingly, the word line NWEi connected to the row decoder 123 is activated (logic high). The word line NWEi is activated after ELEK becomes a logic high and then a half of a period T1 has elapsed. Thus, according to the present invention, the time required for activating the word line can be shorter than in conventional memories.

The PDRASP and the RAi signals which are generated in different portions of the row address control circuit 101 generally require different amounts of time to be input to the row decoder 123. If RAi is input to the row decoder 123 after the PDRASP is input thereto, the row decoder 123 may latch an undesired row address signal, so that the output of the row address buffer 113 has to be maintained in a logic low state after RAi is enabled (logic high). Accordingly, when PDRASP is disabled to a logic low, the complementary row address pulse generator 121 of FIG. 11 enables RAPB. When RAPB toggles low, the output of the fourth NAND gate 173 of FIG. 5 toggles high, so that the first NMOS transistor 161 and the second NMOS transistor 167 are activated. Accordingly, the inputs of the second and third latch portions 163 and 169 toggles low, so that the RAi and RAiB signals are disabled (logic low).

When RAi toggles low, an output signal PDRA of the row predecoder 115 is disabled (logic low).

When a memory device is in a row precharge mode, the logic levels of the RASB and CSB signals are the same as that in the row active mode, however, the WE signal toggles from a logic high to a logic low. At this time, the PWEF signal toggles high. In this state, when the PCLK signal is toggled high, the output of the ninth NAND gate 205 of FIG. 6 toggles high, to thereby switch-off the first PMOS transistor 209. Also, the output of the tenth NAND gate 211 toggles low, to thereby activate the third NMOS transistor 215. Accordingly, the output signal PRB of the fourth latch 217 toggles high. At this time, the output signal PRD of the row address delay signal generator 125 shown in FIG. 9 is disabled (logic low). When the PRD toggles low, an output signal ROWPBP of the row precharge pulse generator 127 shown in FIG. 10 toggles low, to thereby activate the sixth PMOS transistor 251 of FIG. 8. Accordingly, the input of the fifth latch 257 of FIG. 8 becomes a logic high, so that the word line is precharged to a logic low.

According to the present invention, the word line can be enabled in only half of an external clock signal period rather than an entire period. Thus, word line enabling can be approximately 25% faster than in conventional row address control circuits.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A row address control circuit for a memory device comprising:

a row address enable signal generator which produces a row address enable signal which is enabled while a clock signal is enabled;

a row address buffer which receives the output of the row address enable signal generator and produces a row address signal which is enabled while the row address enable signal is enabled;

a row predecoder which receives and predecodes the output of the row address buffer and produces a predecoded row address signal;

a row address strobe buffer which receives the clock signal and produces a first control signal while the clock signal is enabled;

a predecoded row address sampling pulse generator which receives the output of the row address strobe buffer and produces a predecoded row address sampling pulse signal which selects the predecoded row address signal while the first control signal is enabled; and a row decoder which receives the output of the predecoded row address sampling pulse generator and the row predecoder, which includes an output which is connected to a word line and which activates the word line when the predecoded row address signal and the predecoded row address sampling pulse signal are enabled.

2. A row address control circuit for a memory device according to claim 1, wherein the row address enable signal generator comprises:

a first inverter which inverts a data writing enable signal;

a first NAND gate which receives the output of the first inverter, a signal enabled by the clock signal as an inverted row address strobe signal, and an inverted chip select signal;

a first NOR gate which receives the output of the first NAND gate and an inverted column address strobe signal;

a second NAND gate which receives the output of the first NOR gate and the clock; and a second inverter which inverts the output of the second NAND gate and produces a row address enable signal.

3. A row address control circuit for a memory device according to claim 1, wherein the row address buffer comprises:

a third inverter which inverts the clock signal;

a fourth inverter which inverts the output of the third inverter;

a fifth inverter which inverts an external address signal;

a first transmission gate having a gate connected to the output of the third inverter, a complementary gate connected to the output of the fourth inverter, and an input connected to the output of the fifth inverter;

a first latch which receives the output of the first transmission gate;

a sixth inverter which inverts the output of the first latch;

a third NAND gate which inverts the row address enable signal and the clock signal;

a seventh inverter which receives the output of the third NAND gate;

a second transmission gate having a complementary gate connected to the output of the third NAND gate, a gate connected to the output of the seventh inverter, and an input connected to the input of the sixth inverter;

a first NMOS transistor having a drain connected to the output of the second transmission gate and a grounded source;

a second latch having an input connected to the drain of the first NMOS transistor;

an eighth inverter which inverts the output of the second latch;

a second NMOS transistor having a drain connected to the output of the third transmission gate and a grounded source;

a third latch having an input connected to the drain of the second NMOS transistor;

a ninth inverter which inverts the output of the third latch; and a fourth NAND gate which receives the output of the predecoded row address sampling pulse generator and a power supply voltage and has an output connected to the gates of the first and second NMOS transistors.

4. A row address control circuit for a memory device according to claim 1, wherein the row address strobe buffer comprises:

a tenth inverter which inverts an inverted data writing enable signal;

a second NOR gate which receives a refresh counter signal;

an eleventh inverter which inverts an inverted column address strobe signal;

a fifth NAND gate which receives the output of the tenth inverter, the output of the second NOR gate and the inverted column address strobe signal;

a sixth NAND gate which receives a memory bank select signal and the output of the eleventh inverter;

a seventh NAND gate which receives the output of the fifth and sixth NAND gates;

a twelfth inverter which inverts an inverted row address strobe signal;

a thirteenth inverter which inverts the clock signal;

a fourth transmission gate having a complementary gate connected to the clock signal, a gate connected to the output of the thirteenth inverter, and an input connected to the output of the twelfth inverter;

a fourth latch which receives the output of the fourth transmission gate and produces a second control signal;

an eighth NAND gate which receives the output of the fourth latch, the clock signal and an inverted chip select signal;

a fourteenth inverter which inverts the output of the eighth NAND gate;

a ninth NAND gate which receives the output of the tenth inverter, the output of the seventh NAND gate and the output of the fourteenth inverter;

a fifteenth inverter which inverts the output of the ninth NAND gate and produces the first control signal;

a first PMOS transistor having a gate connected to the input of the fifteenth inverter and a source connected to a power supply voltage;

a tenth NAND gate which receives the inverted data writing enabled signal, the output of the eleventh inverter and the output of the fourteenth inverter;

a sixteenth inverter which inverts the output of the tenth NAND gate;

a third NMOS transistor having a gate connected to the output of the sixteenth inverter, a drain connected to the drain of the first PMOS transistor and a grounded source; and a fourth latch having an input connected to the drain of the third NMOS transistor and which produces a third control signal.

5. A row address control circuit for a memory device according to claim 1, wherein the predecoded row address sampling pulse generator comprises:

an eleventh NAND gate which receives a fourth control signal and a self refresh operation signal which is enabled during a self refresh operation;

a seventeenth inverter which inverts the output of the eleventh NAND gate;

eighteenth through twentieth inverters serially connected to the output of the seventeenth inverter;

a twelfth NAND gate which receives the output of the seventeenth inverter and the output of the twentieth inverter;

a twenty-first inverter which inverts a self refresh operation signal;

a second PMOS transistor having a gate connected to the output of the twenty-first inverter and a source connected to a power supply voltage;

a third PMOS transistor having a gate connected to the first control signal and a source connected to the drain of the second PMOS transistor;

a fourth NMOS transistor having a gate connected to the output of the twenty-first inverter and a drain connected to the drain of the third PMOS transistor;

a fifth NMOS transistor having a gate connected to the first control signal, a drain connected to the source of the fourth NMOS transistor and a grounded source;

a fourth PMOS transistor having a drain connected to the drain of the fourth NMOS transistor, a gate connected to a second power supply voltage, and a source connected to the power supply voltage;

a fifth PMOS transistor having a drain connected to the drain of the fourth PMOS transistor, a gate connected to the second power supply voltage, and a source connected to the power supply voltage;

twenty-second and twenty-third inverters serially connected to the drain of the fifth PMOS transistor;

a thirteenth NAND gate which receives the output of the twenty-third inverter and the output of the twelfth NAND gate and produces a predecoded row address sampling pulse signal;

twenty-fourth and twenty-fifth inverters serially connected to the output of the thirteenth NAND gate; and a twenty-sixth inverter having an input connected to the output of the twenty-fifth inverter and an output connected to the gate of the fifth PMOS transistor.

6. A row address control circuit for a memory device according to claim 1, wherein the row decoder comprises:

a sixth PMOS transistor having a gate connected to a fourth control signal for precharging a word line when enabled and a source connected to the second power supply voltage;

a sixth NMOS transistor having a drain connected to the drain of the sixth PMOS transistor and a gate connected to the output of the row predecoder;

a seventh NMOS transistor having a drain connected to the source of the sixth NMOS transistor, a gate connected to the output of the predecoded row address sampling pulse generator, and a grounded source; and a fifth latch having an input connected to the drain of the sixth NMOS transistor and its output connected to the word line.

7. A row address control circuit for a memory device according to claim 1, further comprising:

a row address delay signal generator between the row address strobe buffer and the row decoder, which produces a logic high row address delay signal when a third control signal produced from the row address strobe buffer toggles low, to thereby generate a pulse from the predecoder row address sampling pulse generator during a self refresh operation.

8. A row address control circuit for a memory device according to claim 7, wherein the row address delay signal generator comprises:

a fourteenth NAND gate which receives the third control signal and a self refresh period oscillator output signal to periodically generate a pulse during a self refresh operation, and produces a row address delay signal.

9. A row address control circuit for a memory device according to claim 7, further comprising a row precharge pulse generator between the row address delay signal generator and the row decoder, which produces a pulse when the row address delay signal is disabled, to thereby disable an output signal of the row decoder.

10. A row address control circuit for a memory device according to claim 1, further comprising a row precharge pulse generator between the row address delay signal generator and the row decoder, which produces a pulse when the row address delay signal is disabled, to thereby disable an output signal of the row decoder.

11. A row address control circuit for a semiconductor memory device according to claim 9, wherein the row precharge pulse generator comprises:

a twenty-seventh inverter which inverts the row address delay signal;

twenty-eighth through thirtieth inverters serially connected to the output of the twenty-seventh inverter; and a fifteenth NAND gate which receives the output of the twenty-seventh and thirtieth inverters and produces a row address precharge pulse.

12. A row address control circuit for a memory device according to claim 10, wherein the complementary row address pulse generator comprises:

a thirty-first inverter which inverts the predecoded row address sampling pulse;

a thirty-second inverter which inverts the output of the thirty-first inverter, a thirty-third inverter which inverts the output of the thirty-second inverter;

a third NOR gate which receives the predecoded row address sampling pulse and the output of the thirty-third inverter; and a thirty-fourth inverter which inverts the output of the third NOR gate and produces the complementary row address pulse.

13. A row address control circuit for a memory device according to claim 1, further comprising a complementary address pulse generator between the predecoded row address sampling pulse generator and the row address buffer, which produces an enable signal when the predecoded row address sampling pulse is disabled, to thereby disable an output signal of the row address buffer.

14. A row address control circuit for a memory device, comprising:

a row predecoder which is responsive to a row address signal, to predecode the row address signal and produce a predecoded row address signal;

a predecoded row address sampling pulse generator which is responsive to a clock signal to produce a predecoded row address sampling pulse signal which selects the predecoded row address signal; and a row decoder which receives the output of the predecoded row address sampling pulse generator and the row predecoder, which includes an output which is connected to a word line, and which activates the word line when the predecoded row address signal and the predecoded row address sampling pulse signal are enabled.

15. A row address control circuit for a memory device according to claim 14, wherein the row decoder comprises:

a PMOS transistor having a gate connected to a control signal for precharging a word line when enabled and a source connected to a second power supply voltage;

an NMOS transistor having a drain connected to the drain of the PMOS transistor and a gate connected to the output of the row predecoder; and a latch having an input connected to the drain of the NMOS transistor and its output connected to the word line.

16. A row address control method for a memory device comprising the steps of:

producing a row address enable signal which is enabled while a clock signal is enabled;

producing a row address signal which is enabled while the row address enable signal is enabled;

predecoding the row address signal, to produce a predecoded row address signal;

producing a first control signal while the clock signal is enabled;

producing a predecoded row address sampling pulse signal from the first control signal which selects the predecoded row address signal while the first control signal is enabled; and activating a memory word line when the predecoded row address signal and the predecoded row address sampling pulse signal are enabled.

17. A row address control method for a memory device according to claim 16, further comprising the step of:

producing a logic high row address delay signal when a second control signal produced from the first control signal toggles low, to thereby generate the predecoded row address sampling pulse signal during a self refresh operation.

* * * * *